(12) United States Patent
Yukimoto

(10) Patent No.: US 7,034,340 B2
(45) Date of Patent: Apr. 25, 2006

(54) LIGHT-EMITTING DIODE ARRAY

(75) Inventor: Tomihisa Yukimoto, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 75 days.

(21) Appl. No.: 10/793,218

(22) Filed: Mar. 5, 2004

(65) Prior Publication Data

US 2004/0173802 A1 Sep. 9, 2004

(30) Foreign Application Priority Data

Mar. 7, 2003 (JP) ............................ 2003-062153

(51) Int. Cl.
*H01L 33/00* (2006.01)
(52) U.S. Cl. ......................... 257/88; 257/93
(58) Field of Classification Search .................. 257/88, 257/93
See application file for complete search history.

(56) References Cited

U.S. PATENT DOCUMENTS 5,489,817 A * 2/1996 Muller et al. ............... 313/495

2001/0024921 A1 * 9/2001 Hirano .......................... 445/24
2003/0132447 A1 7/2003 Yakimoto
2004/0245534 A1 * 12/2004 Yamada ........................ 257/94

FOREIGN PATENT DOCUMENTS

JP 2000-323750 11/2000
JP 2003-209280 7/2003

* cited by examiner

Primary Examiner—Long Pham
(74) Attorney, Agent, or Firm—Sughrue Mion, PLLC

(57) ABSTRACT

A light-emitting diode array comprising a conductive layer formed on a substrate; a plurality of separate light-emitting portions formed on the conductive layer; a first electrode formed on at least part of an upper surface of each of the light-emitting portions; and a second electrode formed on the conductive layer adjacent to the light-emitting portions, wherein the second electrode is a common electrode for operating the light-emitting portions, and wherein the conductive layer is removed in areas between adjacent light-emitting portions except for areas constituting current paths to the light-emitting portions.

7 Claims, 9 Drawing Sheets

LIGHT-EMITTING DIODE ARRAY

FIELD OF THE INVENTION

The present invention relates to a high-emission light-emitting diode array, particularly to a light-emitting diode array suitable for light sources of electrophotographic printers, etc.

BACKGROUND OF THE INVENTION

An electrophotographic printer forms an electrostatic latent image on a photosensitive drum by light according to an image signal, develops the latent image by selectively attracting toner thereto, and then transfers the developed image onto a paper to obtain a print image. As a light source for forming the electrostatic latent image, a laser and a light-emitting diode array are widely used. In particular, since a light source constituted by the light-emitting diode array does not need a long optical path unlike the laser-type light source, it is suitable for small-sized printers and large-sized printing. Demand has been mounting recently on light-emitting diode arrays of higher precision and emission, as printing has been becoming faster with higher image quality, and as printers have been becoming smaller.

Widely known is a light-emitting diode having a pair of electrodes on an upper surface (light-extracting side) and a lower surface of a semiconductor substrate with a light-emitting portion. When voltage is applied between the upper-surface electrode and the lower-surface electrode of a light-emitting diode having such a structure, electric current flows in a direction perpendicular to the semiconductor substrate, so that the light-emitting portion emits light due to the recombination of pairs of electrons and holes therein. Therefore, the largest light output is obtained in part of the light-emitting portion directly under the upper-surface electrode. However, because of reflection and absorption by the upper-surface electrode, light generated in that part cannot be efficiently taken out. Hence, conventional light-emitting diodes disadvantageously fail to provide enough light output particularly as light sources of high-resolution printers of 600 dpi, 1200 dpi, etc. needing small light-extracting portions.

JP 2000-323750 A discloses a light-emitting diode array comprising light-emitting diodes each having a light-emitting portion sandwiched by an anode and a cathode on both sides, each light-emitting diode having a current diffusion layer formed directly under a light-emitting surface of the light-emitting portion, and a current-blocking layer formed directly under the anode, wherein electric current from the anode is guided by the current-blocking layer to under the light-emitting surface, and diffused by the current diffusion layer to a whole area directly under the light-emitting surface. However, a sneak current path from the anode to the cathode without passing through an active layer of the light-emitting portion, which does not contribute to light emission, is likely to be formed in a conductive layer in each mesa-etched groove separating the light-emitting portions, resulting in decrease in the light output of the light-emitting diode.

OBJECT OF THE INVENTION

Accordingly, an object of the present invention is to provide a light-emitting diode array suppressing only sneak current not contributing to light emission, thereby providing an increased light output at a low operating voltage.

DISCLOSURE OF THE INVENTION

As a result of intense research in view of the above-mentioned object, the inventor has found that by removing a conductive layer between adjacent light-emitting portions by mesa-etched grooves except for areas for constituting current paths to light-emitting portions to suppress sneak current not contributing to light emission, and by arranging stripe electrodes on light-extracting portions, sneak current contributing to light emission is efficiently led to each light-emitting diode, so that light output can be increased at a low operation voltage. The present invention has been completed based on this finding.

Thus, the light-emitting diode array of the present invention comprises a conductive layer formed on a substrate; a plurality of separate light-emitting portions formed on the conductive layer; a first electrode formed on at least part of an upper surface of each of the light-emitting portions; and a second electrode formed on the conductive layer adjacent to the light-emitting portions, the second electrode being a common electrode for operating a plurality of the light-emitting portions, and the conductive layer being removed between adjacent light-emitting portions except for areas constituting current paths to the light-emitting portions.

In the light-emitting diode array of the present invention, the light-emitting portions are preferably formed by dividing an epitaxial layer formed on the conductive layer by mesa-etched grooves. The light-emitting diode array according to a preferred embodiment comprises first and third mesa-etched grooves for separating the light-emitting portions from bonding portions, and second mesa-etched grooves for separating the light-emitting portions from each other, thereby forming a plurality of separate light-emitting portions. The conductive layer between the light-emitting portions is removed by the second mesa-etched groove, so that there is no sneak current not contributing to light emission between each of the first electrodes and the second electrode.

It is preferable that each light-emitting portion comprises a light-extracting portion, and that a portion of each second mesa-etched groove formed in the conductive layer extends between the adjacent light-emitting portions except between the adjacent light-extracting portions.

A portion of the first mesa-etched groove formed in the conductive layer and portions of the second mesa-etched grooves formed in the conductive layer preferably constitute an integral, comb-shaped groove.

Portions of the second mesa-etched grooves formed in the conductive layer preferably extend from a portion of the first mesa-etched groove formed in the conductive layer to a line defined by a boundary between the first electrode and the light-extracting portion on each light-emitting portion.

Further, the formation of the first electrode in a stripe shape on the light-extracting portion of the light-emitting portion leads sneak current to just under the light-extracting portion, thereby efficiently increasing light output even at a low driving voltage. The stripe electrodes are preferably connected to each other in a mesh manner. The stripe electrodes are preferably formed by a high-concentration semiconductor layer. The term "high-concentration semiconductor layer" used herein means a semiconductor layer having high conductivity by including a high concentration of an impurity.

According to the light-emitting diode array of the present invention, a current path between the first and second electrodes can be efficiently led to jut under the light-extracting portion to improve an internal light-emitting efficiency, so that light output can be increased without raising a driving voltage.

DETAILED DESCRIPTION OF THE PREFERRED EMBODIMENTS

Figure 8:
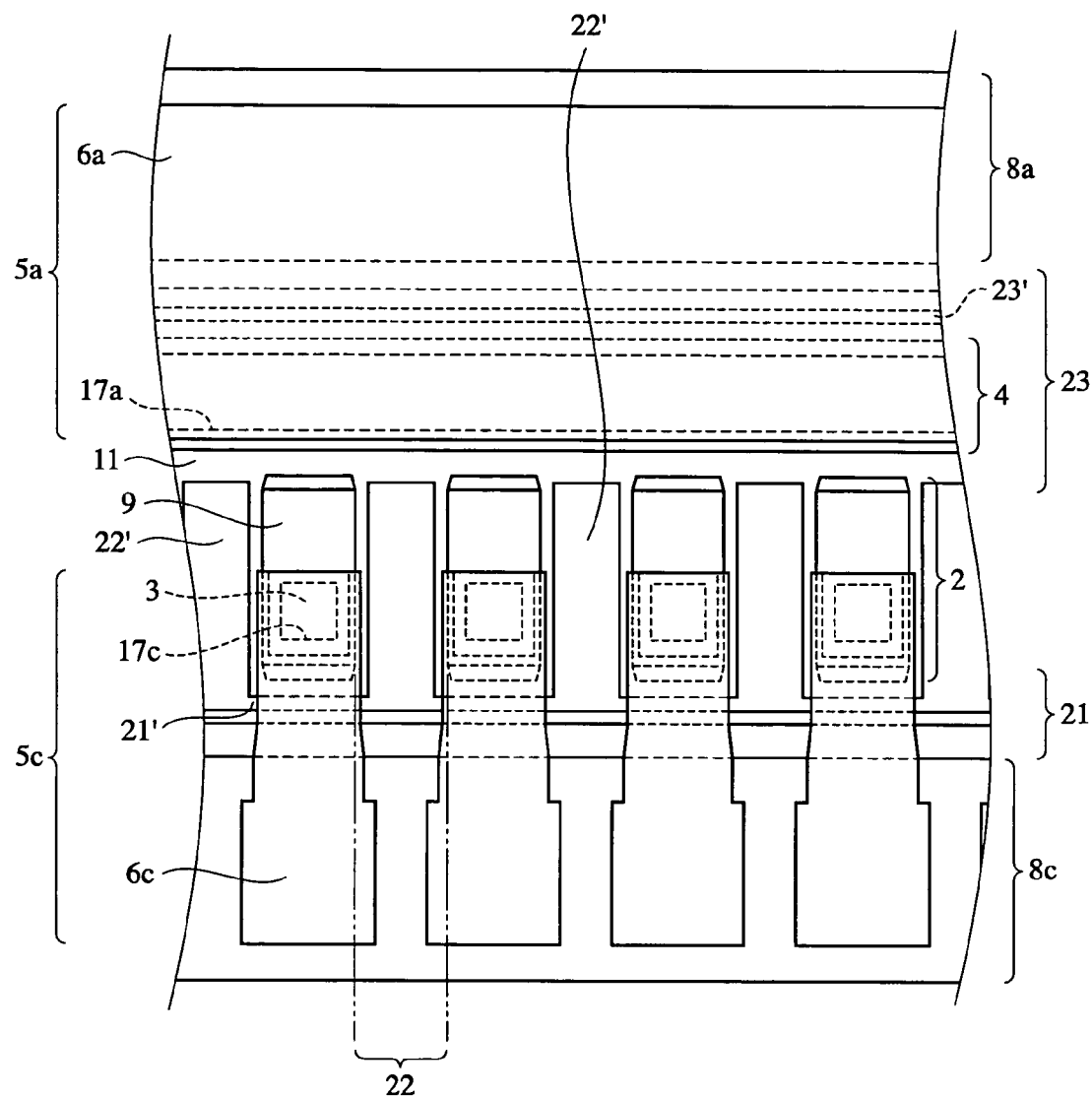
FIG. 8 is a plan view showing a light-emitting diode array, to which the present invention is applicable.
Figure 9A:
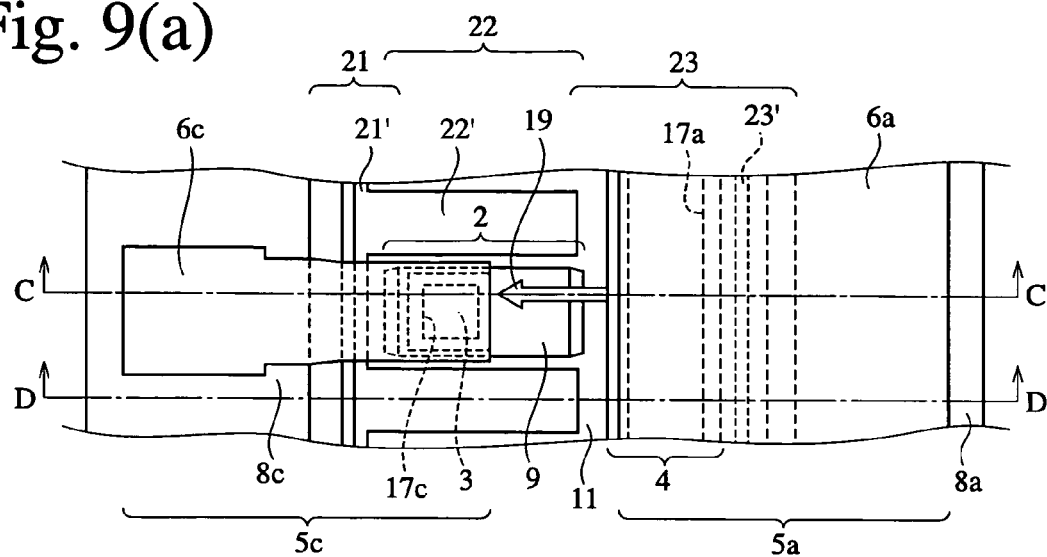
FIG. 9(a) is a plan view showing a unit cell constituting the light-emitting diode array shown in FIG. 8.
Figure 9B:
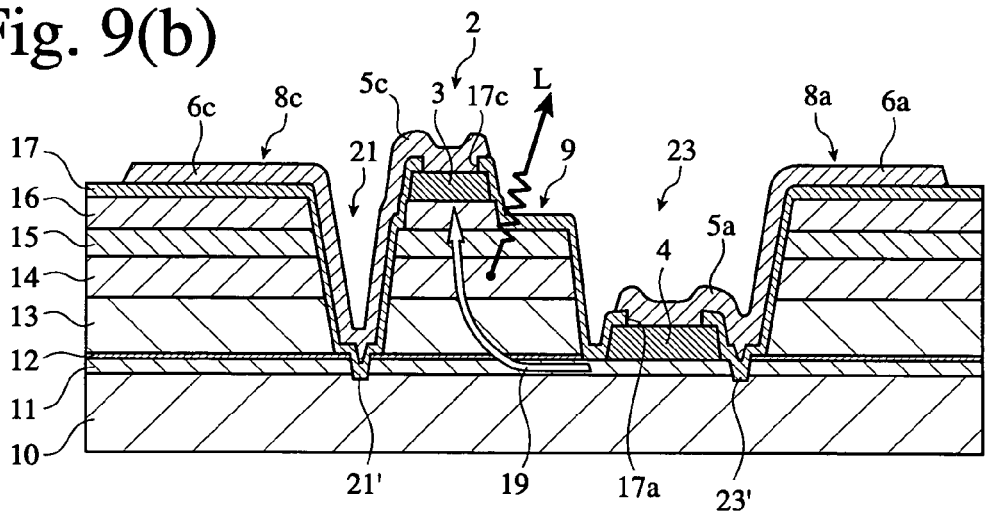
FIG. 9(b) is a cross-sectional view taken along the line C—C in FIG. 9(a)
Figure 9C:
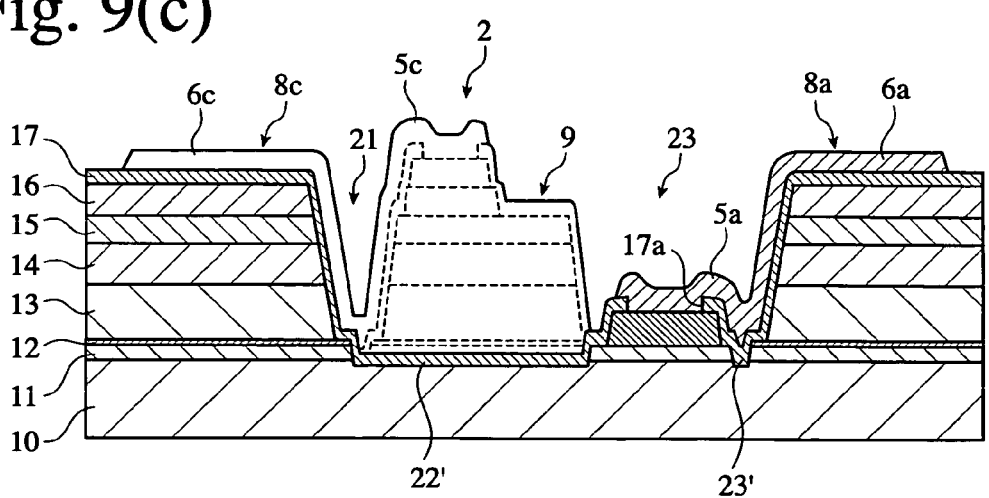
FIG. 9(c) is a cross-sectional view taken along the line D—D in FIG. 9(a).

Before delving into the details of the present invention, a light-emitting diode array having an anode and cathodes on the same surface of a substrate for emitting light with improved efficiency, to which the present invention is applicable, will be discussed. FIG. 8 is a plan view showing this light-emitting diode array, and FIG. 9(a) shows a unit cell in FIG. 8. FIG. 9(b) is a cross-sectional view taken along the line C—C in FIG. 9(a), and FIG. 9(c) is a cross-sectional view taken along the line D—D in FIG. 9(a). A plurality of light-emitting portions 2 are arranged at predetermined intervals on a p-type GaAs conductive layer 11 formed on an n-type GaAs substrate 10. Each light-emitting portion 2 comprises a p-type AlGaAs etching-stopper layer 12, a p-type AlGaAs clad layer 13, a p-type AlGaAs active layer 14, an n-type AlGaAs clad layer 15, and an n-type GaAs cap layer 16, which are laminated on the p-type GaAs conductive layer 11 in this order. The light-emitting diode area of the light-emitting portion 2 has a double-hetero structure composed of the p-type AlGaAs clad layer 13, the p-type AlGaAs active layer 14, and the n-type AlGaAs clad layer 15.

Each light-emitting portion 2 is formed by removing part of epitaxial layers by mesa etching. An entire mesa-etched groove is constituted by first and third mesa-etched grooves 21, 23 for separating the light-emitting portions 2 from bonding portions 8a, 8c, and second mesa-etched grooves 22 for separating the adjacent light-emitting portions 2.

Each light-emitting portion 2 has a cathode 3 formed on part of the upper surface thereof. An anode 4 provided on the p-type GaAs conductive layer 11 in the form of a strip adjacent to the light-emitting portion 2 is formed by the vapor deposition of a metal on the p-type GaAs conductive layer 11 and a heat treatment for turning the metal to an alloy with the metal of the conductive layer 11. The light-emitting portions 2 and an exposed surface of the conductive layer 11 are covered by an insulating layer 17 made of PSG (phosphorus glass) except for contact holes 17c, 17a of the insulating layer 17 on the cathodes 3 and the anode 4, respectively. An Au wiring layer 5c is formed, such that it has one end connected to the cathode 3 not covered by the insulating layer 17, and the other end extending to a surface of the bonding portion 8c to form a bonding pad 6c. An Au wiring layer 5a is formed, such that it has one end connected to the anode 4 and the other end extending to a surface of the bonding portion 8a to form a bonding pad 6a.

In the light-emitting diode array having such a structure, a current path 19 from the anode 4 to the cathode 3 passes through the light-emitting portion 2, and light L is generated from the p-type AlGaAs active layer 14 in that path. This light L is emitted from a light-extracting portion 9 provided by etching the n-type GaAs cap layer 16. As seen in FIGS. 9(a) to (c), this light-emitting diode array comprises first and third mesa-etched grooves 21, 23 separating the light-emitting portions 2 from the bonding portions 8a, 8c, and second mesa-etched grooves 22 separating the adjacent light-emitting portions 2, such that each light-emitting portion 2 exists like an island on the substrate 10. The current path 19 is guided by portions 22' of the second mesa-etched grooves 22 removing the p-type GaAs conductive layer 11 between the adjacent light-emitting portions 2, from the anode 4 to the cathodes 3 via the p-type AlGaAs active layer 14 under the light-extracting portions 9. Therefore, current paths not contributing to light emission can be cut off, resulting in efficient light output.

It has been found, however, that if this sneak current were cut off completely in the above-mentioned light-emitting diode array, a forward electric current IF would be limited to the current path 19, requiring a large operating voltage for obtaining a desired level of light output, and thus failing to satisfy recent demand for low power consumption. The light-emitting diode array of the present invention having a structure free from the above problem will be explained below in detail.

[1] Structure of Light-Emitting Diode Array

Figure 1:
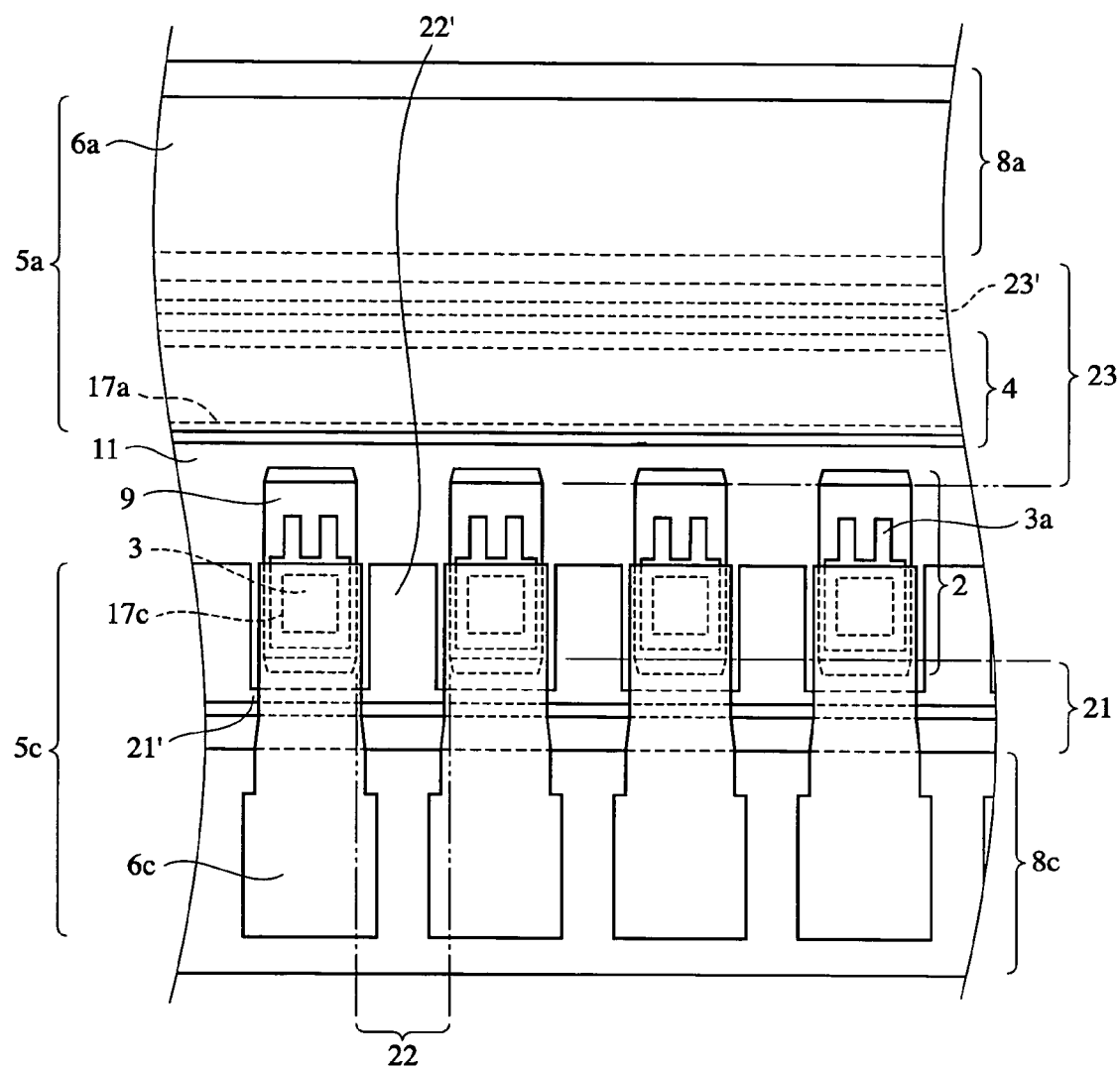
FIG. 1 is a plan view showing the light-emitting diode array according to an embodiment of the present invention.
Figure 2A:
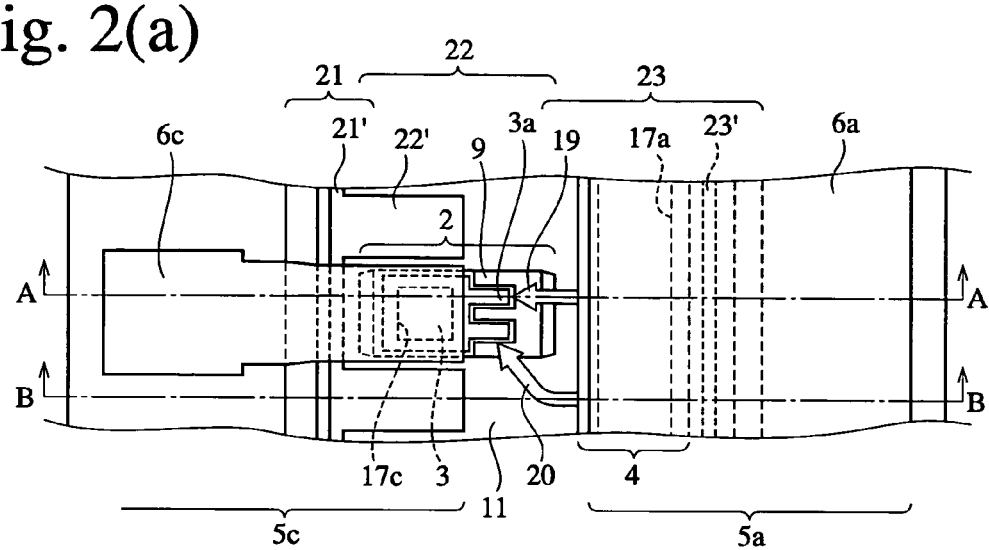
FIG. 2(a) is a plan view showing a unit cell constituting the light-emitting diode array shown in FIG. 1.
Figure 2B:
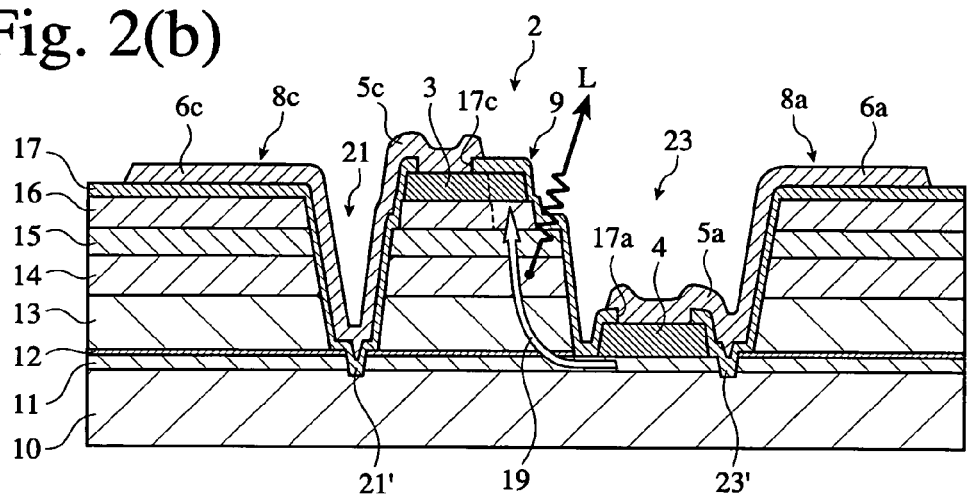
FIG. 2(b) is a cross-sectional view taken along the line A—A in FIG. 2(a)
Figure 2C:
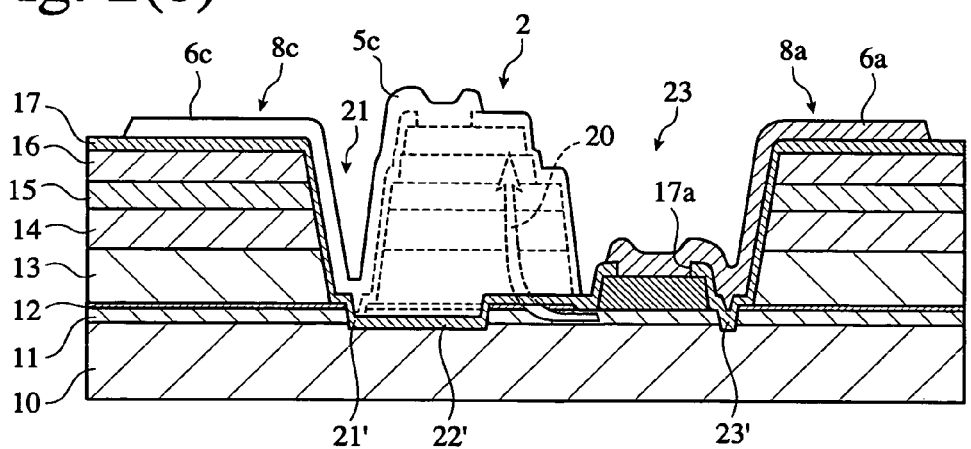
FIG. 2(c) is a cross-sectional view taken along the line B—B in FIG. 2(a)
Figure 3A:
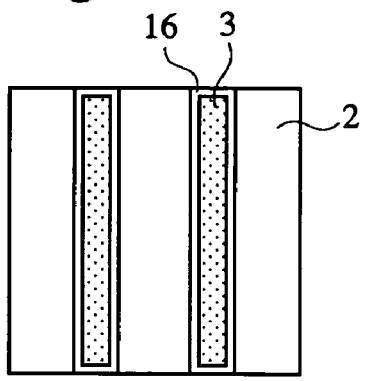
FIG. 3 is a plan view showing various examples of the light-emitting surface and electrode structure of the light-emitting diode array of the present invention.
Figure 3B:
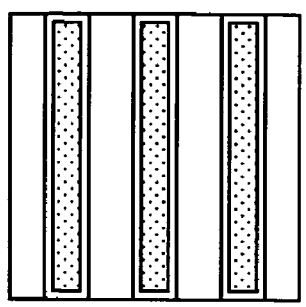
Figure 3C:
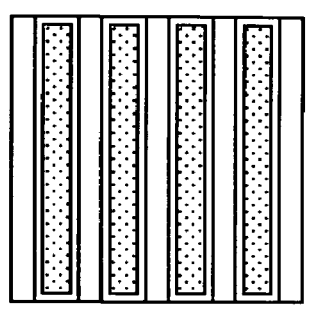
Figure 3D:
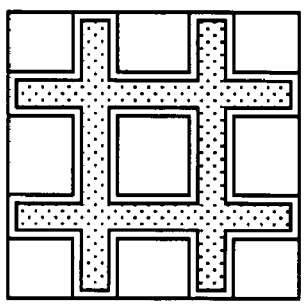
Figure 3E:
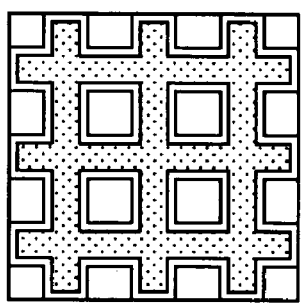
Figure 3F:
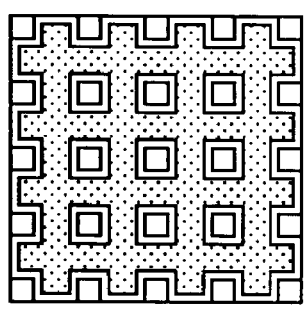
Figure 3G:
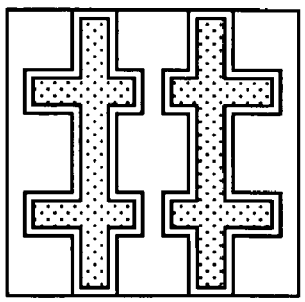
Figure 3H:
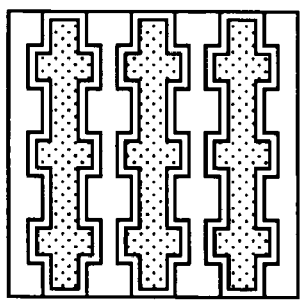
Figure 4A:
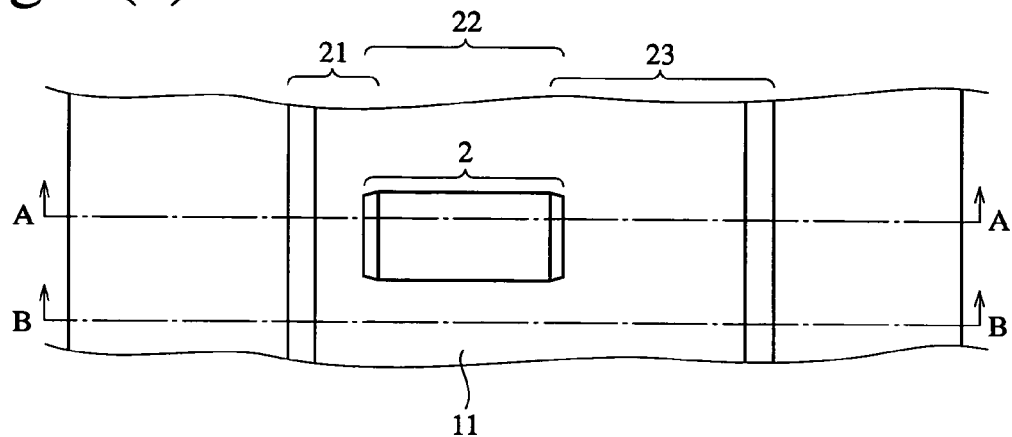
FIG. 4(a) is a plan view showing a unit cell, in which mesa-etched grooves for removing an epitaxial layer except for a conductive layer to form separate light-emitting portions are formed.
Figure 4B:
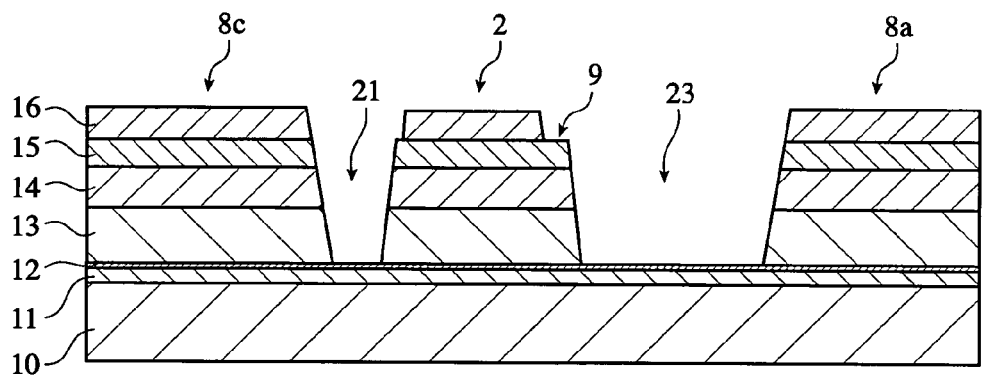
FIG. 4(b) is a cross-sectional view taken along the line A—A in FIG. 4(a)
Figure 4C:
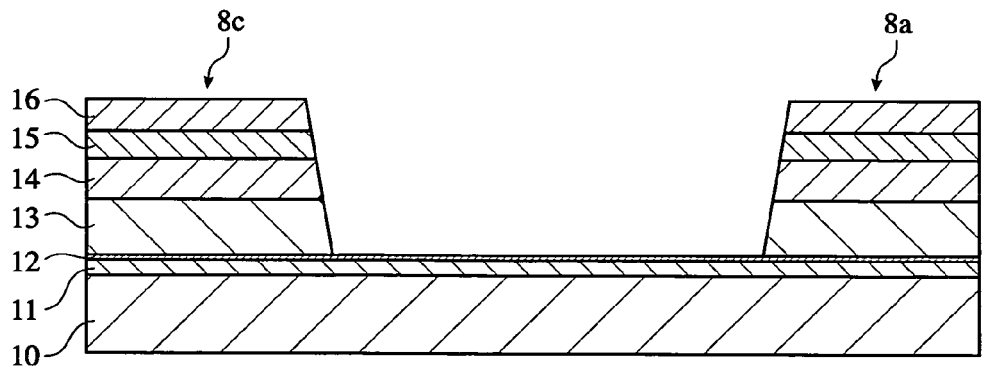
FIG. 4(c) is a cross-sectional view taken along the line B—B in FIG. 4(a)

As shown in FIGS. 1 and 2, the light-emitting diode array of the present invention comprises a substrate 10, a plurality of light-emitting portions 2 formed on the substrate 10, a first electrode 3 formed partially on an upper surface of each light-emitting portion 2, and a second electrode 4 formed on a conductive layer 11 adjacent to the light-emitting portions 2. In the illustrated embodiment, each light-emitting portion 2 is a separate epitaxial layer obtained by forming mesa-etched grooves in an epitaxial layer uniformly formed on the substrate 10.

(1) Substrate

The substrate 10 may be anything that can be used for light-emitting diodes, as long as it is electrically insulated from the light-emitting portions. Either of an n-type substrate and a p-type substrate may be used. A semi-insulating substrate such as a semi-insulating GaAs substrate, etc. or an insulating substrate may also be used. The substrate 10 may be insulated from the conductive layer 11 with a high-resistivity layer such as an undoped GaAs layer formed therebetween, or with a semiconductor layer opposite in polarity to the conductive layer 11.

(2) Light-Emitting Portion

The type and thickness of a compound semiconductor crystal layer formed on the conductive layer 11 on the substrate 10 may be properly selected depending on the desired wavelength and output of light emitted. Usable as the compound semiconductors are, for example, AlGaAs, AlGaInP, etc. The light-emitting portion 2 preferably has a double-hetero structure comprising a clad layer of a first conductive type, an active layer and a clad layer of a second conductive type, which is preferably formed by dividing the epitaxial layer formed on the conductive layer by mesa-etched grooves.

In the illustrated embodiment, each light-emitting portion 2 in the light-emitting diode array of the present invention comprises a p-type AlGaAs etching-stopper layer 12, a p-type AlGaAs clad layer 13, a p-type AlGaAs active layer 14, an n-type AlGaAs clad layer 15, and an n-type GaAs cap layer 16, which are successively formed on the p-type GaAs conductive layer 11 on the substrate 10. The n-type GaAs cap layer 16 in the light-extracting portion 9 is removed by etching. To avoid short-circuiting with an Au wiring layer 5, an insulating layer 17 such as an insulating PSG layer covers the entire surface of the light-emitting portion 2 except a cathode 3. It should be noted that the insulating PSG layer is omitted in the plan views of FIGS. 1 and 2 for simplicity.

An area directly associated with light emission in the light-emitting portion 2 has a double-hetero structure in which the p-type AlGaAs active layer 14 having an energy band gap corresponding to the light-emitting wavelength is sandwiched by the p-type AlGaAs clad layer 13 (first-conductive-type clad layer), and the n-type AlGaAs clad layer 15 (second-conductive-type clad layer) both having larger energy band gaps than that of the layer 14.

(3) Electrode and Wiring Layer

One of the first and second electrodes may be a cathode, and the other may be an anode. For example, the first electrode may be a cathode or an anode. Since each electrode is required to have good bonding characteristics, and ohmic connectivity and adhesion to an underlying layer, it is preferably composed of a plurality of metal layers. Further, each electrode may have an oxide layer, with an uppermost layer preferably made of a metal having good bonding characteristics, such as Ti/Au, Mo/Au, etc. For example, the anode may be a laminate electrode of AuZn/Ni/Au, and the cathode a laminate electrode of AuGe/Ni/Au, etc.

In each electrode, the metal layers can be formed by a vapor deposition method such as a resistance-heating vapor deposition method, an electron beam-heating vapor deposition method, etc., and the oxide layer can be formed by various known film-forming methods. A heat treatment (alloying) is preferably performed on the metal layers, to make an ohmic electrode.

In the embodiment shown in FIGS. 1 and 2, the cathode 3 is formed on the mesa-top surface of each light-emitting portion 2, such that the cathode 3 has a plurality of stripes on the light-extracting portion 9. One feature of this light-emitting diode array is that part of the n-type GaAs cap layer 16 is removed by etching in a comb shape, so that part of the n-type AlGaAs clad layer 15 is exposed in a comb shape, whereby the light-extracting portion 9 is formed in a comb shape, and that the cathode 3 is formed in a comb shape on the top of the n-type GaAs cap layer 16 remaining in a comb shape, to have ohmic contact with each other. For instance, the cathode 3 has two stripe electrodes on each light-emitting portion 2 as shown in FIG. 1. The shape of the stripe electrodes is not limited to this example but may be multiple stripes, meshes, etc. as shown in FIG. 3. The stripe electrodes may be formed by a high-concentration semiconductor in addition to the above cathode materials.

The side surfaces of each light-emitting portion 2 and the periphery of each cathode 3 are covered with the insulating layer (insulating PSG layer) 17 (not shown in FIG. 1). The cathode 3 of each light-emitting portion 2 is connected to an end of an Au wiring layer 5c, whose other end constitutes each bonding pad 6c in a bonding portion 8c. The stripe-shaped anode 4, a common electrode, is formed on the p-type GaAs conductive layer 11 in an ohmic contact manner at a position adjacent to each light-emitting portions 2. The anode 4 is connected to a bonding pad 6a via an Au wiring layer 5a.

(4) Mesa-Etched Groove

The mesa-etched groove for forming separate light-emitting portions 2 comprises first and third mesa-etched grooves 21, 23 separating the light-emitting portions 2 from bonding portions 8a, 8c, and second mesa-etched grooves 22 separating the adjacent light-emitting portions 2. The first mesa-etched groove 21 is formed between the light-emitting portions 2 and the bonding portion 8c on the side of the cathode 3, with the deepest portion 21' removing the conductive layer 11. The third mesa-etched groove 23 is formed between the light-emitting portions 2 and the bonding portion 8a on the side of the anode 4, with the deepest portion 23' removing the conductive layer 11. The deepest portion 22' of the second mesa-etched groove 22 removes the conductive layer 11 between the adjacent light-emitting portions 2.

The portion 21' of the first mesa-etched grooves 21 formed in the conductive layer 11 is integrally connected to the portion 22' of the second mesa-etched grooves 22 formed in the conductive layer 11, to provide a comb-shaped groove as a whole. Another feature of the light-emitting diode array according to the illustrated embodiment is that the portion 22' of the second mesa-etched grooves 22 formed in the conductive layer 11 extends in an area between the adjacent light-emitting portions 2 except between their light-extracting portions 9. Accordingly, in this embodiment, a tip end of the portion 22' of the second mesa-etched grooves 22 formed in the conductive layer 11 is located substantially on a line defined by a boundary between the first electrode 3 and the light-extracting portion 9.

[2] Operation of Light-Emitting Diode Array

Because there is a potential difference between the p-type GaAs conductive layer 11 in ohmic contact with the anode 4 and the cathode 3 formed on each light-emitting portion 2, a current path 19 passes through the p-type GaAs conductive layer 11 under the light-emitting portion 2, resulting in the generation of light L from the p-type AlGaAs active layer 14 in the light emission area. The light L is taken out from the light-extracting portion 9.

Like the light-emitting diode array shown in FIGS. 8 and 9, sneak current paths not contributing to light emission among the current paths from the anode 4 to the cathodes 3 are blocked by the portions 22' of the second mesa-etched grooves 22 formed in the conductive layer 11. Current 20 attracted to the stripe electrodes 3a passes through the light-emitting portions 2, resulting in contributing to increase in the efficiency of internal light emission. This increases a current density in the current path 19 passing through the p-type AlGaAs active layer 14 in the light-emitting portions 2, thereby increasing light emission. The light-emitting diode array having the illustrated structure can produce light output 1.5 times that of the array shown in FIGS. 8 and 9 without raising a driving voltage.

To further increase the light output of the light-emitting diode array, an electric current flow may be induced from the cathode 3 to an area under the light-extracting portion 9. In this case, a current-blocking layer is provided just under the cathode 3, and a current diffusion layer is provided just under the light-extracting portion 9. The current diffusion layer is made of a compound having little light absorption in the light emission wavelength and small resistivity. With this structure, electric current is led by the current-blocking layer from the cathode 3 to the area under the light-extracting portion 9, and uniformly diffused by the current diffusion layer in the entire area of the light-extracting portion 9 to pass through the light-emitting portion 2.

[3] Production of Light-Emitting Diode Array

The light-emitting diode array of the present invention can be produced by the same method as that shown in FIGS. 8 and 9, except that (a) the conductive layer 11 between the light-emitting portions 2 is removed by the portions 22' of the second mesa-etched grooves 22, and that (b) the cathode 3 in a shape having openings such as stripes (comb) is formed on the n-type GaAs cap layer 16 having the same shape in an ohmic contact manner. In the preferred production method, the p-type GaAs conductive layer 11 (carrier concentration=$4 \times 10^{19}$ cm$^{-3}$, thickness=1 µm), the p-type AlGaAs etching stopper layer 12 (carrier concentration=$3 \times 10^{19}$ cm$^{-3}$, thickness=0.1 µm), the p-type AlGaAs clad layer 13 (carrier concentration=$1 \times 10^{18}$ cm$^{-3}$, thickness=1 µm), the p-type AlGaAs active layer 14 (carrier concentration=$1 \times 10^{18}$ cm$^{-3}$, thickness=1 µm), the n-type AlGaAs clad layer 15 (carrier concentration=$2 \times 10^{18}$ cm$^{-3}$, thickness=3 µm), and the n-type GaAs cap layer 16 (carrier concentration=$1 \times 10^{18}$ cm$^{-3}$, thickness=0.5 µm) are first successively grown on the n-type GaAs substrate 10 by a metal organic vapor phase growth (MOVPE) method.

The resultant crystal layers are subjected to selective wet etching. First, the n-type GaAs cap layer 16 is removed in the light-emitting portions 2 except its portions in contact with the cathodes 3 to form light-extracting portions 9. Next, the first to third mesa-etched grooves 21–23 are formed to such a depth that the p-type GaAs conductive layer 11 is exposed, to divide the epitaxial layers on the p-type GaAs conductive layer 11 to plural light-emitting portions 2 separated from the bonding portions 8a, 8c.

Figure 5A:
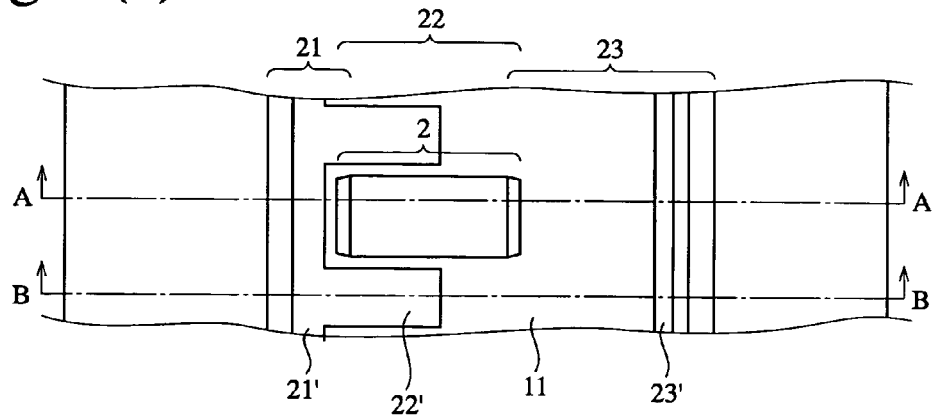
FIG. 5(a) is a plan view showing a unit cell, in which first to third mesa-etched grooves removing the conductive layer are formed.
Figure 5B:
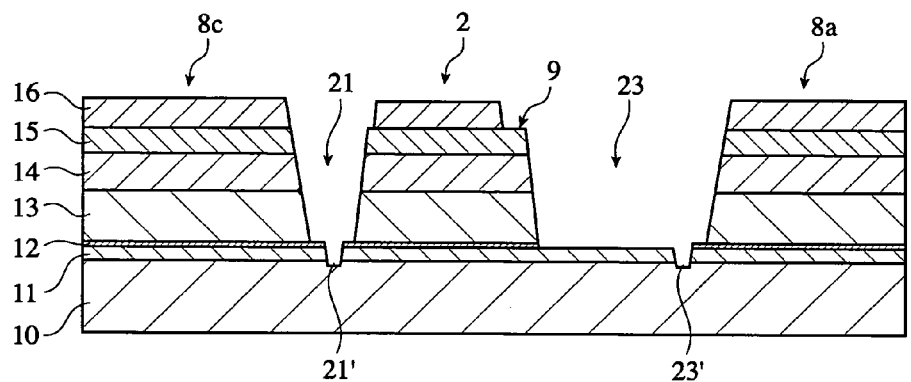
FIG. 5(b) is a cross-sectional view taken along the line A—A in FIG. 5(a)
Figure 5C:
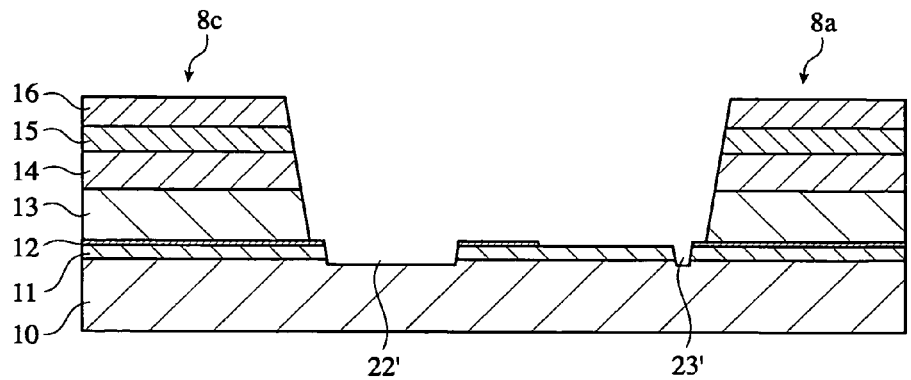
FIG. 5(c) is a cross-sectional view taken along the line B—B in FIG. 5(a)

Further, as shown in FIGS. 5(a)–(c), a portion of the first mesa-etched groove 21 is etched deep to have a groove 21' removing a portion of the p-type GaAs conductive layer 11 between the light-emitting portions 2 and the bonding portion 8c, and a portion of the third mesa-etched groove 23 is etched deep to have a groove 23' removing a portion of the p-type GaAs conductive layer 11 between the light-emitting portions 2 and the bonding portion 8a. Also, the portions 22' of the second mesa-etched grooves 22 extending in areas except for those between the light-extracting portions 9 are as deep as removing the conductive layer 11. In this case, the deepest portions 21'–23' of the first to third mesa-etched grooves 21–23 preferably have such depth that the n-type GaAs substrate 10 is slightly etched, so that no conductive layer 11 remains in areas corresponding to the deepest portions 21'–23' even though there are etching errors.

Figure 6A:
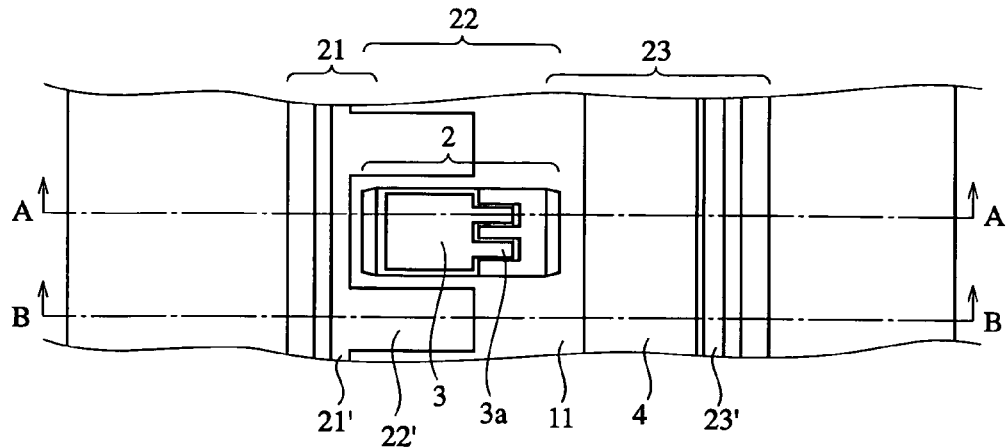
FIG. 6(a) is a plan view showing a unit cell, in which first and second electrodes are formed.
Figure 6B:
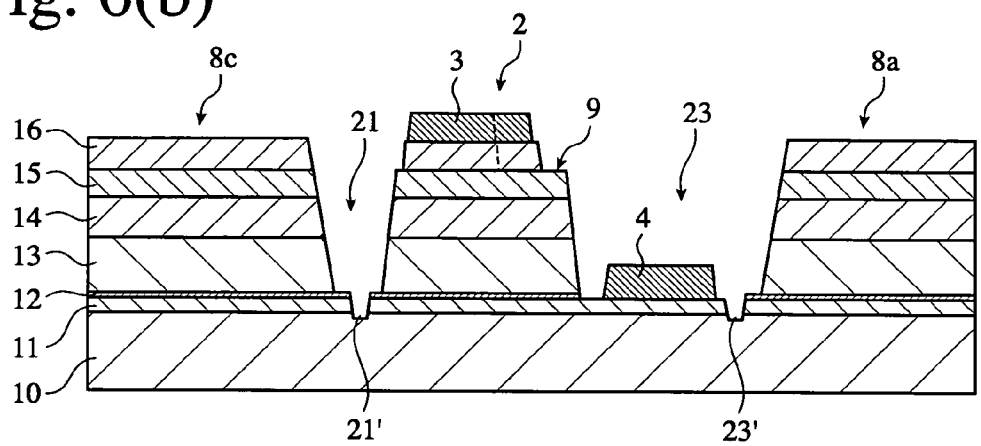
FIG. 6(b) is a cross-sectional view taken along the line A—A in FIG. 6(a)
Figure 6C:
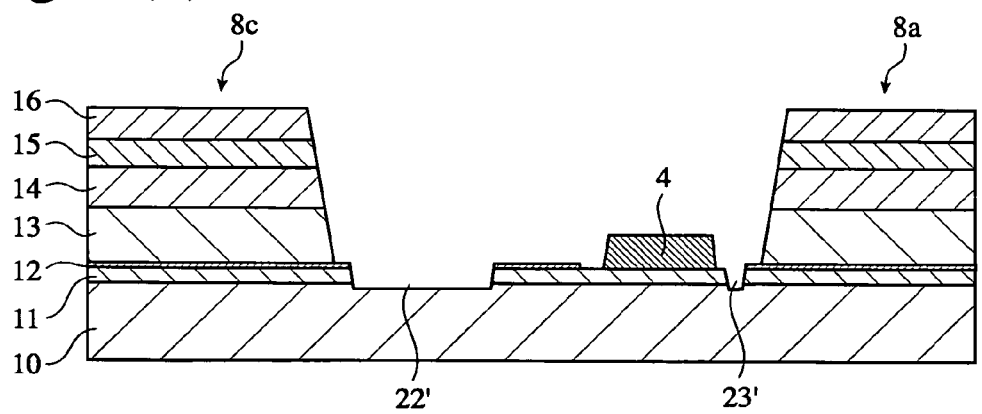
FIG. 6(c) is a cross-sectional view taken along the line B—B in FIG. 6(a)
Figure 7:
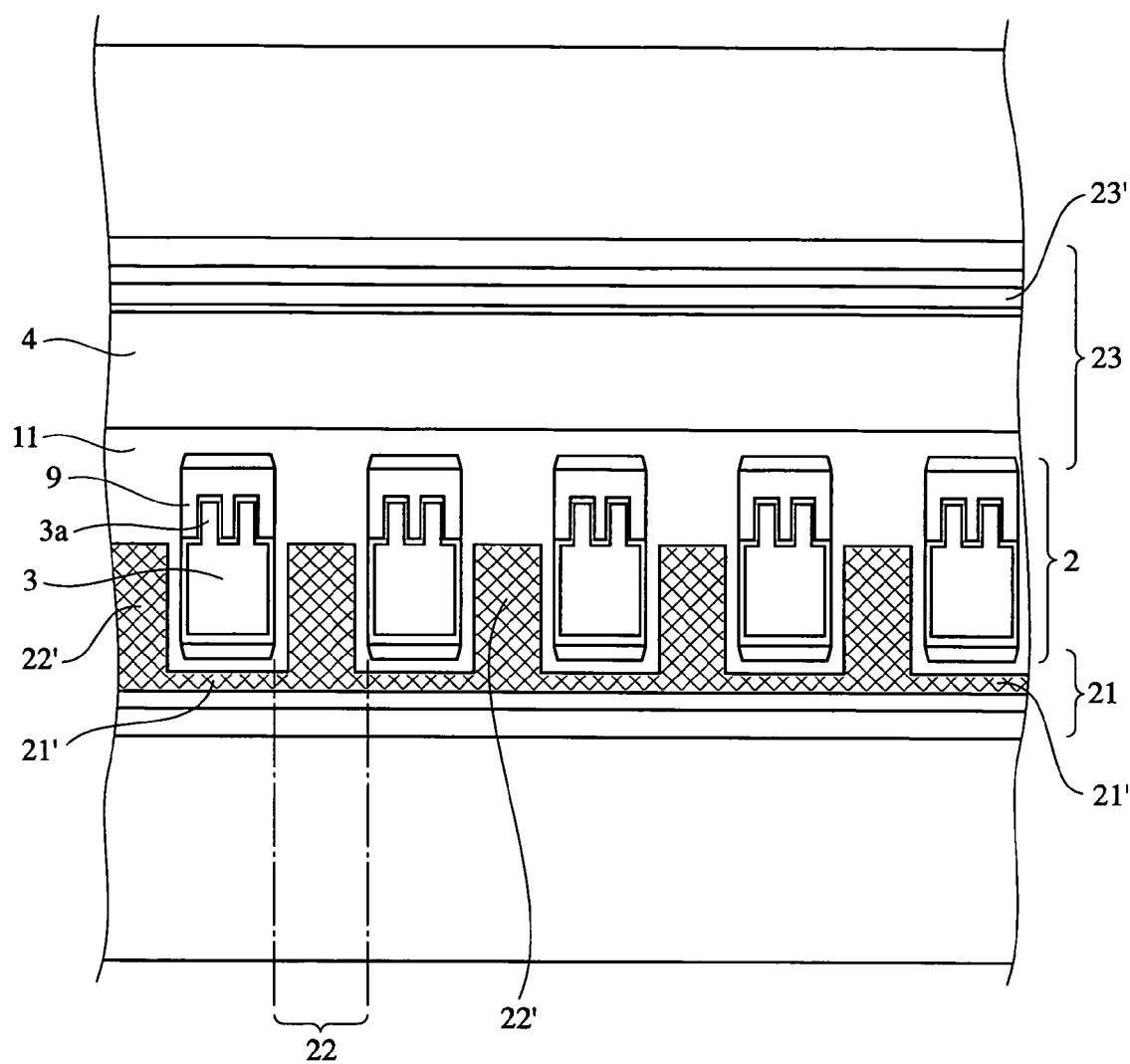
FIG. 7 is a plan view showing the light-emitting diode array of the present invention having an integral, comb-shaped groove constituted by the first and second mesa-etched grooves.

After the PSG layer 17 is grown by a chemical vapor deposition CVD) method such that it covers the entire upper surface of the light-emitting diode array, only part of the PSG layer 17, in which the cathodes 3 and the anode 4 are formed, is removed with hydrofluoric acid. Next, AuGe/Ni/Au is vapor-deposited to form the cathodes 3, and AuZn/Ni/Au is then vapor-deposited to form the anode 4. After growing the insulating layer (PSG layer) 17 again by a CVD method, only portions of the PSG layer 17 on the cathodes 3 and the anode 4 are removed with hydrofluoric acid to have contact holes 17c, 17a, and the Au wiring layers 5c, 5a are formed such that they extend to the bonding portions 8c, 8a. FIGS. 6(a)–(c) show a unit cell of the light-emitting diode array having electrodes formed, with the PSG layer 17 and the Au wiring layers 5a, 5c omitted for simplicity. Also, FIG. 7 shows an upper surface of the light-emitting diode array having a plurality of the unit cells of FIG. 6, with the PSG layer 17 and the Au wiring layers 5a, 5c omitted for simplicity. FIG. 7 clearly shows the arrangement of the stripe electrodes 3a and comb-shaped grooves each constituted by the deepest portions 21' and 22' of the first and second mesa-etched grooves 21 and 22.

As described above in detail, because portions of the conductive layer between the adjacent light-emitting portions are removed by mesa-etched grooves, and the stripe electrodes are formed on the light-extracting portions in the light-emitting diode array of the present invention, electric current passing through each light-emitting portion between the first and second electrodes can be efficiently utilized. Therefore, the current path between the first and second electrodes can be efficiently led to under the light-extracting portions, thereby increasing the density of electric current passing through the active layer of the internal light-emitting portions, and thus increasing light emission without raising a driving voltage. Such light-emitting diode arrays are suitable as light sources for electrophotographic printers, etc.

What is claimed is:

1. A light-emitting diode array comprising a conductive layer formed on a substrate; a plurality of separate light-emitting portions formed on said conductive layer; a first electrode formed on at least part of an upper surface of each of said light-emitting portions; and a second electrode formed on said conductive layer adjacent to said light-emitting portions, wherein said second electrode is a common electrode for operating said light-emitting portions, and wherein said conductive layer is removed between adjacent light-emitting portions except for areas constituting current paths to the light-emitting portions, which light-emitting diode comprises first and third mesa-etched grooves separating said light-emitting portions from bonding portions, and second mesa-etched grooves separating said light-emitting portions from each other, thereby forming a plurality of separate light-emitting portions; and wherein said second mesa-etched grooves remove said conductive layer between adjacent light-emitting portions, thereby controlling current paths between said first electrodes and said second electrode.

2. The light-emitting diode array according to claim 1, wherein each light-emitting portion comprises a light-extracting portion, and wherein a portion of each second mesa-etched groove formed in said conductive layer extends between said adjacent light-emitting portions except between said adjacent light-extracting portions.

3. The light-emitting diode array according to claim 1, wherein a portion of said first mesa-etched groove formed in said conductive layer and portions of said second mesa-etched grooves formed in said conductive layer constitute an integral, comb-shaped groove.

4. The light-emitting diode array according to claim 3, wherein portions of said second mesa-etched grooves formed in said conductive layer extend from a portion of said first mesa-etched groove formed in said conductive layer to a line defined by a boundary between said first electrode and said light-extracting portion on each light-emitting portion.

5. The light-emitting diode array according to claim 1, wherein said first electrode comprises one or more stripe electrodes having a predetermined width.

6. The light-emitting diode array according to claim 5, wherein said stripe electrodes are connected to each other to form a reticulated structure.

7. The light-emitting diode array according to claim 5, wherein said stripe electrodes are formed by a high-concentration semiconductor layer.

* * * * *